(12) United States Patent
Hammond

(10) Patent No.: US 6,529,396 B2
(45) Date of Patent: Mar. 4, 2003

(54) ADDRESS DECODER OPTIMIZATION

(75) Inventor: Paul Hammond, Bristol (GB)

(73) Assignee: STMicroelectronics Limited, Almondsbury (GB)

( * ) Notice: Subject to any disclaimer, the term of this patent is extended or adjusted under 35 U.S.C. 154(b) by 215 days.

(21) Appl. No.: 09/730,521

(22) Filed: Dec. 5, 2000

(65) Prior Publication Data

US 2001/0036111 A1 Nov. 1, 2001

(30) Foreign Application Priority Data

Dec. 10, 1999 (GB) .............................................. 9929372

(51) Int. Cl.[7] ................................................. G11C 5/06
(52) U.S. Cl. ...................... 365/63; 365/51; 365/230.06; 716/13
(58) Field of Search ................. 716/12, 13; 365/230.06, 365/51, 63

(56) References Cited

U.S. PATENT DOCUMENTS 5,784,330 A  7/1998  Beck et al. ............ 365/230.06

FOREIGN PATENT DOCUMENTS

EP   0 520 650 A1   12/1992

OTHER PUBLICATIONS

EPO, Standard Search Report for UK Appl. No. 9929372.2.

Primary Examiner—David L. Robertson
(74) Attorney, Agent, or Firm—Jenkens & Gilchrist, P.C.

(57) ABSTRACT

An method of arranging address decoders in an improved manner in an integrated circuit memory is discussed. In the integrated circuit memory the address lines extending from the address circuitry of the integrated circuit memory are connected to address decoders, each word line of the memory being connected to an address decoder. The address decoders are connected to the address lines in a certain combination such that only one of the address lines is connected to adjacent address decoders. When connected in this manner the average propagation delay of each address line is substantially uniform. By reducing the maximum propagation delay in comparison with previously known arrangements of address decoders the speed at which the memory can be operated is increased.

9 Claims, 7 Drawing Sheets

| PROPAGATION DELAY VALUE | ADDRESS LINE | | | |
|---|---|---|---|---|
| | $a_3$ | $a_2$ | $a_1$ | $a_0$ |
| 15 | 1 | 1 | 1 | 1 |
| 14 | 1 | 1 | 1 | 0 |
| 13 | 1 | 1 | 0 | 1 |
| 12 | 1 | 1 | 0 | 0 |
| 11 | 1 | 0 | 1 | 1 |
| 10 | 1 | 0 | 1 | 0 |
| 9  | 1 | 0 | 0 | 1 |
| 8  | 1 | 0 | 0 | 0 |
| 7  | 0 | 1 | 1 | 1 |
| 6  | 0 | 1 | 1 | 0 |
| 5  | 0 | 1 | 0 | 1 |
| 4  | 0 | 1 | 0 | 0 |
| 3  | 0 | 0 | 1 | 1 |
| 2  | 0 | 0 | 1 | 0 |
| 1  | 0 | 0 | 0 | 1 |
| 0  | 0 | 0 | 0 | 0 |
PROPAGATION VALUE SUM FOR: $a_3 = 15 + 14 + 13 + 12 + 11 + 10 + 9 + 8 = 92$
$a_2 = 15 + 14 + 13 + 12 + 7 + 6 + 5 + 4 = 76$
FIG. 2b
(PRIOR ART)
$a_1 = 15 + 14 + 11 + 10 + 7 + 6 + 3 + 2 = 68$
$a_0 = 15 + 13 + 11 + 9 + 7 + 5 + 3 + 1 = 64$
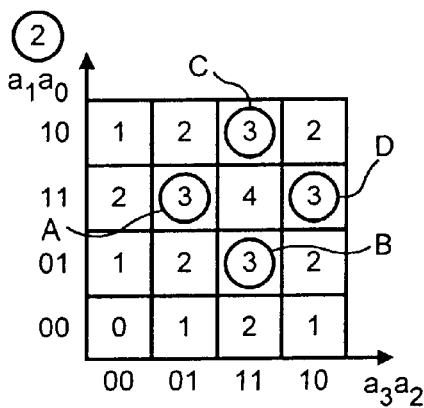
FIG. 3a
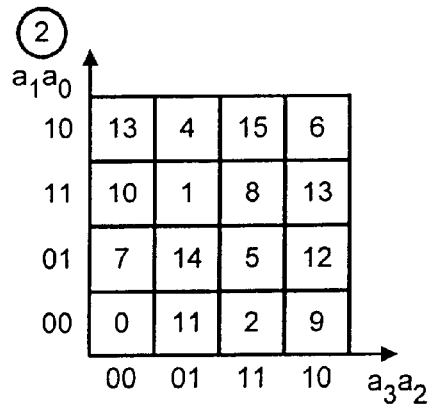
FIG. 3b

| PROPAGATION DELAY VALUE | ADDRESS LINE | | | |
|---|---|---|---|---|
| | $a_3$ | $a_2$ | $a_1$ | $a_0$ |
| 15 | 1 | 1 | 1 | 0 |
| 14 | 0 | 1 | 0 | 1 |
| 13 | 0 | 0 | 1 | 0 |
| 12 | 1 | 0 | 0 | 1 |
| 11 | 0 | 1 | 0 | 0 |
| 10 | 0 | 0 | 1 | 1 |
| 9 | 1 | 0 | 0 | 0 |
| 8 | 1 | 1 | 1 | 1 |
| 7 | 0 | 0 | 0 | 1 |
| 6 | 1 | 0 | 1 | 0 |
| 5 | 1 | 1 | 0 | 1 |
| 4 | 0 | 1 | 1 | 0 |
| 3 | 1 | 0 | 1 | 1 |
| 2 | 1 | 1 | 0 | 0 |
| 1 | 0 | 1 | 1 | 1 |
| 0 | 0 | 0 | 0 | 0 |

$a_3 = 15 + 12 + 9 + 8 + 6 + 5 + 3 + 2 = 60$ $a_2 = 15 + 14 + 11 + 8 + 5 + 4 + 2 + 1 = 60$ $a_1 = 15 + 13 + 10 + 8 + 6 + 4 + 3 + 1 = 60$ $a_0 = 14 + 12 + 10 + 8 + 7 + 5 + 3 + 1 = 60$

|   | | | ① $a_5a_4$ | ② $a_3a_2$ | ③ $a_1a_0$ |
|---|---|---|---|---|---|
| 1 | 1 | OPERATION A | 00 | 00 | 00 |
|   | 2 | " A | 01 | 11 | 11 |
|   | 3 | " A | 11 | 00 | 00 |
|   | 4 | " B | 10 | 11 | 11 |
| 2 | 1 | OPERATION A | 01 | 10 | 00 |
|   | 2 | " A | 11 | 01 | 11 |
|   | 3 | " A | 10 | 10 | 00 |
|   | 4 | " B | 00 | 01 | 11 |
| 3 | 1 | OPERATION A | 11 | 11 | 00 |
|   | 2 | " A | 10 | 00 | 11 |
|   | 3 | " A | 00 | 11 | 00 |
|   | 4 | " B | 01 | 00 | 11 |
| 4 | 1 | OPERATION A | 10 | 01 | 00 |
|   | 2 | " A | 00 | 10 | 11 |
|   | 3 | " A | 01 | 01 | 00 |
|   | 4 | " C | 11 | 10 | 11 |
| 1 | 1 | OPERATION A | 00 | 01 | 10 |
|   | 2 | " A | 01 | 10 | 01 |
|   | 3 | " A | 11 | 01 | 10 |
|   | 4 | " B | 10 | 10 | 01 |
|   |   |   | 01 | 11 | 11 |

ADDRESS DECODER OPTIMIZATION

FIELD OF THE INVENTION

The present invention relates to an integrated circuit memory having address decoders connected to address lines in an improved arrangement, a method of manufacturing an integrated circuit memory having such an improved arrangement of address decoders and a method of determining the connection between address decoders and address lines for such an improved arrangement.

BACKGROUND OF THE INVENTION

Memory arrays comprise storage elements or cells which are arranged in rows and columns. Rows are addressable by word lines which extend in a first direction and columns are addressable via bit lines which extend perpendicularly to the word lines. For convenience the word lines will be referred to hereinafter as running in the horizontal direction. Each word line is connected to a corresponding address decoder which upon receipt of a particular address asserts the corresponding word line. Normally, the address decoders are physically located adjacent the memory array in a vertical column. The address decoders receive the address via address lines which are commonly arranged such that they extend vertically (i.e. in the same direction as the bit lines) of the memory array. It has previously been known to arrange the address decoders such that the address decoder selected by the highest "value" of address word, i.e. 1111 for a four bit address, is connected to the first word line of the memory array with each subsequent address decoder being selected by the next highest "value" of address word, in ordered sequence. This arrangement of address decoders in ordered address word sequence means that the average propagation delay experienced by a signal propagating along the address line corresponding to the most significant bit of an address word is higher than the average propagation delay for the address line corresponding to the lowest significant bit. This will be explained in more detail hereinafter. The speed at which the address decoders can be operated at is therefore limited by the largest propagation delay on the most significant bit address line.

It is an aim of embodiments of the present invention to provide a method for arranging the address decoders in an improved manner so that the average propagation delay for each address line can be made more uniform, preferably the delay is minimised and made equal to each other. By reducing the maximum propagation delay in this way the speed at which the address decoders for a memory array can be operated at is increased.

SUMMARY OF THE INVENTION

According to the present invention there is provided an integrated circuit memory comprising: a plurality of storage elements arranged in rows and columns; a plurality of word lines, each word line connected to a respective row of storage elements and being connected to a respective address decoder; a plurality of address lines extending from address circuitry to said address decoders, each address decoder being connected to a certain combination of said address lines representing a certain address value to which the address decoder responds to assert its associated word line, wherein said address decoders are connected to said address lines in a manner which is out of order with respect to an ordered sequence of said address values.

Preferably the address decoders are arranged such that only one of the address lines is connected to adjacent ones of said address decoders.

According to the present invention there is also provided A method of manufacturing an integrated circuit memory comprising: a plurality of storage elements arranged in rows and columns; a plurality of word lines, each word line connected to a respective row of storage elements and being connected to a respective address decoder; and a plurality of address lines extending from address circuitry to said address decoders, the method comprising: connecting each of said address decoders to a certain combination of address lines representing a certain address value to which that address decoder responds, wherein said connecting step is carried out so as to arrange the address decoders out of order with respect to an ordered sequence of said address values.

According to the present invention there is further provided A method of determining the connections between a plurality of address decoders and a plurality of address lines in a memory array, said method comprising: denoting n pairs of address bits, wherein the nth pair of address bits are the least significant bits of an address word; defining n operations of said n pairs of address bits, each operation changing the value of the address word when performed on said address word, wherein each Kth operation, where K is an integer between 1 and n, comprises incrementing the Kth pair of address bits by one term of a 2 bit Gray code and inverting the remaining pairs of address bits; performing said n operations in a predetermined sequence wherein operation (K+1) is performed every 4K operations, otherwise operation 1 is performed, where K increments from 1 to (n−1), whereby a sequence of address words is generated wherein only a single bit has the same value for adjacent address words in said generated sequence of address words.

Preferably the average propagation delay of said address lines is substantially equal.

It will be appreciated that an ordered sequence denotes a sequence where the values to which each address decoder responds increases in an ordered manner between the address decoder connected to the lowermost word line and that connected to the uppermost word line.

For a better understanding of the present invention and as to how the same may be carried into effect, reference may now be made by way of example to the accompanying drawings in which:

BRIEF DESCRIPTION OF THE DRAWINGS

FIG. 2b illustrates the values of average propagation delay for the address lines of FIG. 1;

FIG. 3a is a karnaugh map representation of the number of bits which change between four bit address words;

FIG. 3b is a karnaugh map representation of the optimized arrangement for address decoders using four bit address words according to the present invention;

FIG. 7 illustrates the arrangement of some of the address decoders using six bit address words according to the present invention.

DESCRIPTION OF THE PREFERRED EMBODIMENT

Figure 1:
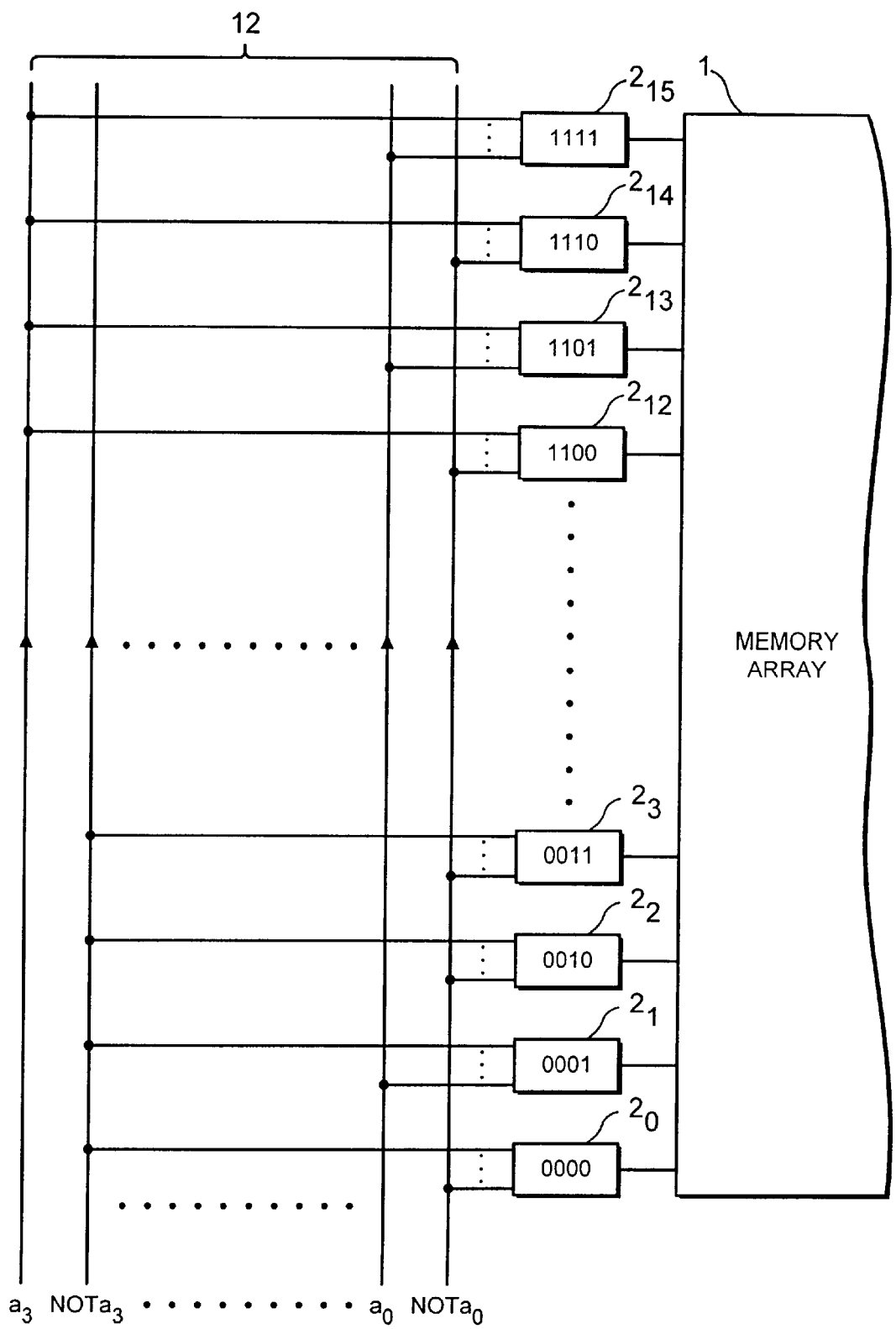
FIG. 1 shows the arrangement of a known memory array and address decoders.

A memory array, having address word decoders and address lines arranged as is known in the prior art is shown in FIG. 1. The memory array 1 shown in FIG. 1 is addressed using four bit address words and thus has four address channels 12 connected to sixteen address decoders. Each address channel 12 comprises a true address line and a complementary address line. For clarity, only the address line $a_3$ corresponding to the most significant bit of the address word and its complementary address line $NOTa_3$ are together with the address lines $a_0$ and $NOTa_0$ for the least significant bit of the address word are shown. Each address decoder is connected to four address lines, the connection corresponding to the address word to which the address decoder is responsive. For ease of understanding, the combination of address lines to which each decoder is responsive is shown in FIG. 1. For example, the first address decoder $2_{15}$ which is physically located at one end of the memory array, is arranged to be responsive to the address word 1111 and is hence connected to the true bit lines for the address lines $a_3$, $a_2$, $a_1$ and $a_0$. The address decoder $2_{14}$ which is adjacent to the first address decoder $2_{15}$ is, as is known in the prior art, arranged to be addressed by the next "highest" value of address word, i.e. 1110 and is thus connected to address lines $a_3$, $a_2$, $a_1$, and $NOTa_0$.

Similarly, the third address decoder $2_{14}$ which is adjacent to the second address decoder $2_{14}$ is connected to address lines $a_3$, $a_2$, $NOTa_1$, and $a_0$. This ordered sequential arrangement of address decoders continues until the last address decoder $2_{00}$, which is responsive to the lowest value of address word 0000, is connected to $NOTa_3$, $NOTa_2$, $NOTa_1$ and $NOTa_0$.

The address signals propagate along the address channels in the direction of the arrows shown in FIG. 1 from addressing circuitry (not shown) at the bottom part of the array. Hence it would be appreciated that any signal applied to address line $a_3$ must travel at least a distance equal to half the physical size of the memory array, with signals to be applied to the first address decoder $2_{15}$ travelling a distance equal to the full physical size of the memory array 1. The electrical resistance of the address lines is a constant value R per unit length of the address line. Thus the resistance of an address line for a connection to an upper address decoder, decoder $2_{15}$ say, is significantly more than the resistance of the same address line for a connection to a lower address decoder, decoder $2_{00}$ say. The propagation delay of a signal transmitted along an address line is determined by the RC time constant, which is effected by the apparent resistance experienced by the signal. Thus all of the signals which are applied to address line $a_3$ experience a relatively large propagation delay. However, for address line $a_0$ it will be seen that alternate address decoders are connected to this address line. Consequently although some signals which are applied to address line $a_0$ may have to travel the full length of the memory array before being received by the appropriate address decoder and thus are subject to a relatively large resistance and high RC time constant, other signals which are intended for address decoders responsive to a relatively low "value" address word travel a relatively small distance and so are only subject to a low resistance and low RC time constant. The result is that for address line $a_0$ the average propagation delay of a signal applied to that address line is lower than the average delay experienced by a signal applied to address line $a_3$.

Figure 2A:
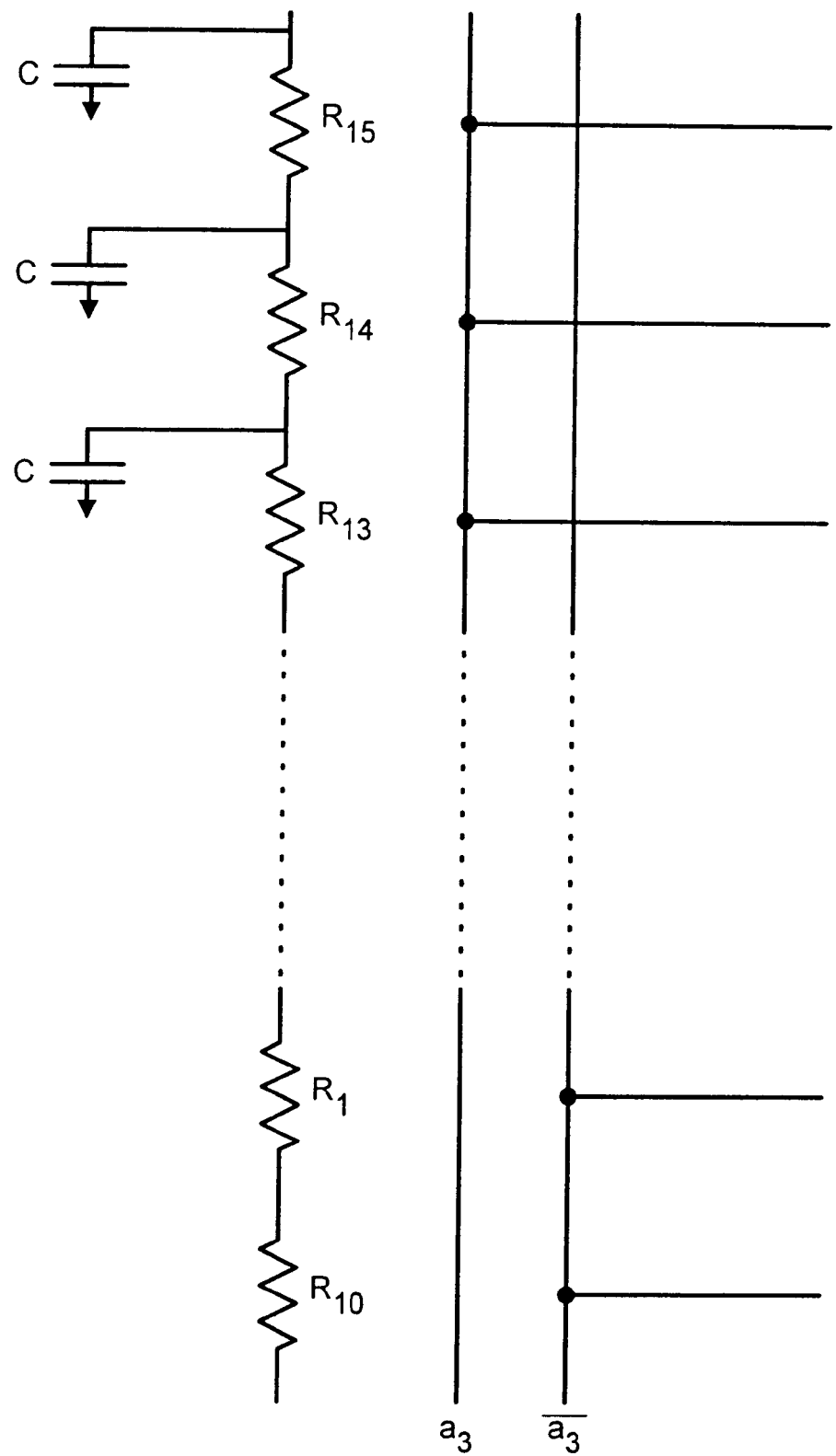
FIG. 2a schematically illustrates a method of approximating the average propagation delay for an address line.

The actual values of the average propagation delays experienced by each address line can be approximated using the Elmore approximation. With reference to FIG. 2a, address lines $a_3$ and $NOTa_3$ are shown. Also shown is a number of series connected resistors $R_{15}$–$R_0$. Each resistor represents a unit resistance of the address lines $a_3$ or $NOTa_3$. Connected to each resistor is a unit capacitance C. The combination of unit resistance and the unit capacitance represents a unit propagation delay (RC) for the address lines. According to an Elmore approximation, a signal which travels to the furthest address decoder, first address decoder $2_{15}$, will suffer a propagation delay of 15RC propagation delay units, assuming no other decoders are connected to that address line. If another address decoder is connected to that address line, address decoder $2_8$ for example, the average propagation delay is given as 15RC+8RC=23RC. Using this approximation it is possible to calculate a figure for each address line which is indicative of the average delay experienced by a signal propagating through a given address line. For each address line, the value of the propagation delay units for each address decoder connection is summed. This is shown in FIG. 2b for the decoder arrangement shown in FIG. 1. The address word value for each address decoder is shown together with the corresponding value of the propagation delay unit required for a signal to reach that address decoder. Thus, for example, for address line $a_3$ address decoders are connected to this address line at points on the address line which have a propagation delay unit value of 15 to 8 RC respectively. The sum of these values is 92. The corresponding values for address lines $a_2$, $a_1$, and $a_0$ are 76, 68 and 64 respectively. The same calculations can be made for $NOTa_3$–$NOTa_0$ giving values of 28, 44, 52 and 56. The average value for any pair of true and complementary address lines is 60.

The embodiments of the invention discussed herein reduce the propagation delay values of these address lines. In embodiments of the present invention, the arrangement of the address line decoders is altered to achieve this aim. In particular, the address line decoders are arranged out of the "value" sequence of FIG. 1 so that all address lines except one are alternated between each address decoder. The method of the present invention which will now be described allows such an arrangement of address decoders to be determined for any memory array which is addressed using an address word with an even number of bits, although the present invention is equally applicable to memory arrays addressed using address words with an odd number of bits.

As a first example we shall consider the case for a four bit address word, as in FIGS. 1 and 2. We wish to find a sequence of address words in which three out of the four address bits changes from one address word to the next. This corresponds to the requirement that all except one of the address lines is connected to alternative address decoders. It is possible to derive this information from a karnaugh map representation. Such a karnaugh map is shown in FIG. 3a. The two most significant bits of the address word, $a_3$ and $a_2$ are labelled along the x-axis and are denoted as bit-pair 1. Similarly, address bits $a_1$ and $a_0$ are labelled along the y-axis and are denoted as bit-pair 2. Each pair of bits is labelled according to a two bit Gray code. A property of a Gray code is that subsequent terms of the code only change by a single bit at a time. This can be seen from FIG. 3a where for either pairs of bits only a single bit changes between adjacent terms. Each square within the map of FIG. 3a represents a four bit address word. If the address word 0000 is taken as our initial address word, then the figures within the boxes on FIG. 3a represent the number of bits which differ between 0000 and the address word corresponding to that particular square. Thus it can be seen from FIG. 3a that four address words have three different bits from 0000. They are 1101, 0111, 1110 and 1011.

It is a property of the karnaugh map shown in FIG. 3a that the map wraps around on itself. That is to say that if the map were to be continued along either axis it would be the same as beginning again at the origin. This gives the karnaugh map the property that which ever address is chosen to be at the origin of the map, in this case 0000, the resulting map is always the same.

Figure 4:
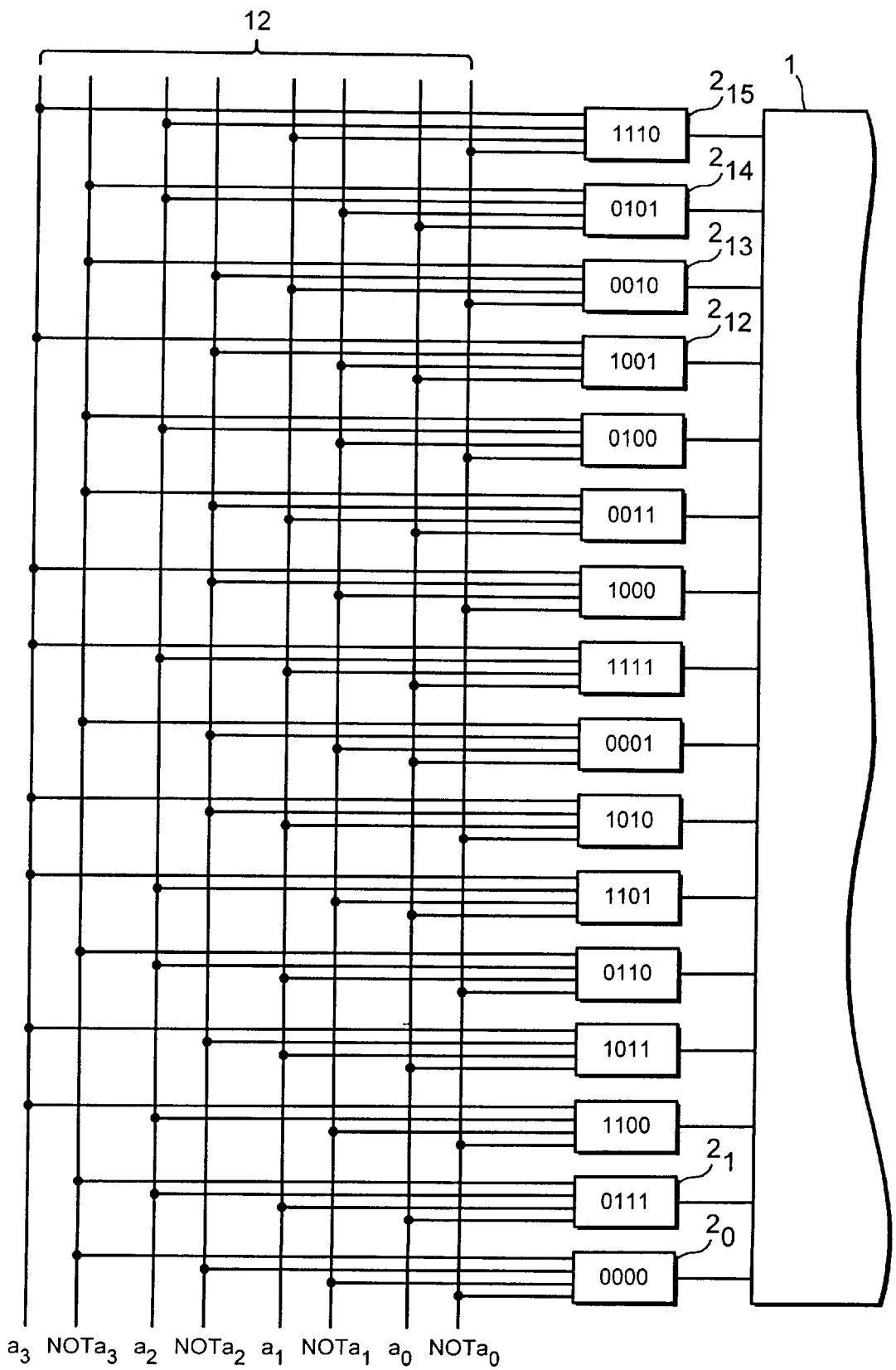
FIG. 4 shows an arrangement of address decoders according to an embodiment of the present invention.
Figures 5, 6A:
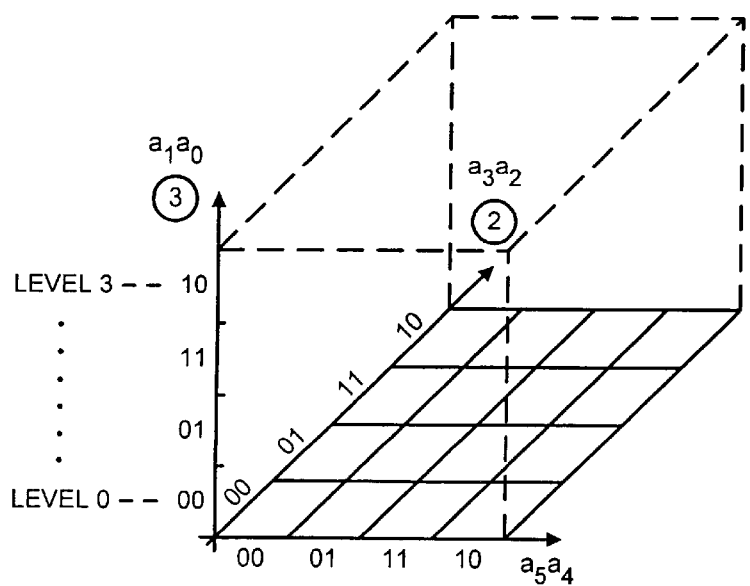
FIG. 5 illustrates the values of average propagation delay for the address lines of FIG. 4.
FIG. 6a is a 3-D karnaugh map representation for a six bit address word.
Figure 6B:
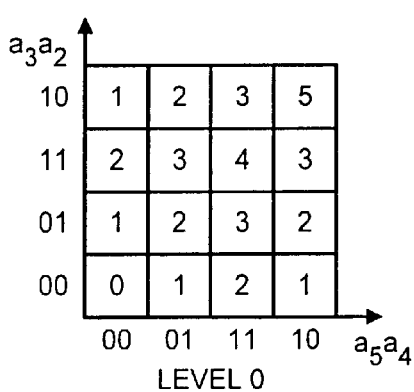
FIGS. 6b to 6e are the karnaugh map representations for each level of the map shown in FIG. 6a showing the number of bits which change between address words.
Figure 6C:
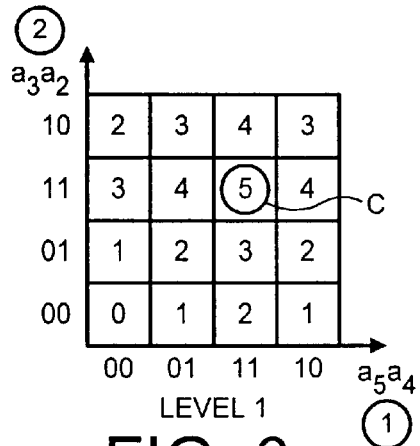
Figure 6D:
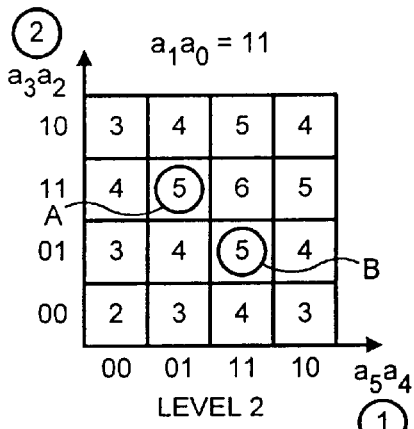
Figure 6E:
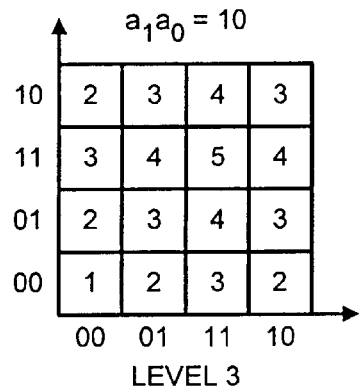

In FIG. 3a it can be seen that two of the map locations corresponding to address words having three bits different from 0000 are denoted as A and B. The change of address bits represented by operation A can be represented as incrementing address bit-pair 1 by one term of the Gray code and inverting the values of address bit-pair 2. Similarly operation B can be represented as inverting the values of bit-pair 1 and incrementing the value of bit-pair 2 by one term of the Gray code. It has been found that by following a sequence of operation A and operation B it is possible to create a sequence of address words in which all of the bits in the address word except one alternate between adjacent address words in the sequence. If address word 0000 is to activate the lowest address decoder, as in FIG. 1, then by following the particular sequence of operations the addresses of adjacent address decoders can be determined. This is shown schematically in FIG. 3b. FIG. 4 shows the arrangement of the address decoders determined in FIG. 3b according to the present invention in a corresponding manner to FIG. 1. FIG. 5 shows the values representative of the average propagation delay for each address line of FIG. 4 in a similar manner to that of FIG. 2b. It can be seen that the values indicative of average propagation delay for each address line are not only equal to each other with a value of 60, but also this value is equal to the average value of any pair of true and complementary address lines as previously noted with reference to FIG. 2b.

The sequence of operations which is required to produce the above described arrangement of address decoders is to perform operation A unless the resulting word address has already occurred in which case a single step according to operation B is performed before resuming with operation A.

With reference to FIG. 3a, it will be appreciated that the operations represented by C and D are in fact the inverse of operations A and B. That is to say operation C can be represented as decrementing the value address bit-pair 1 by one term of the Gray code and inverting the values of address bit-pair 2 while operation D can be represented as inverting the values of address bit-pair 1 and decrementing address bit pair 2 by one term of the Gray code of the required sequence of operations being to perform operation D unless the word address repeats in which case a single operation C should be performed before resuming the sequence of operation D. Although a different arrangement of address decoders will result, the average propagation value for each address line will be the same as that shown in FIG. 5.

FIG. 6a shows the equivalent three-dimensional karnaugh map representation for a six bit address word. In a similar fashion to the karnaugh map shown in FIG. 3a, the x-axis of the map shown in FIG. 6a represents the two most significant bits of the address word, $a_5a_4$, while the y-axis represents the next two most significant bits, $a_3a_2$. However in this case aaxis represents the least two significant bits of the address word $a_1a_0$, which are denoted bit pair 3. Although it is possible to produce a two-dimensional karnaugh map representation of a six bit address word where each axis has a three bit Gray code incremented along it, such a two-dimensional map does not share the property of the twodimensional map having a two bit Gray code for each axis in which the map produced is always the same regardless of which address word is chosen to be at the origin. This property is only present in a two-dimensional karnaugh map using a two bit Gray code and is an important feature in the present invention.

FIGS. 6b–6e represent the two-dimensional karnaugh maps for each different level of the three-dimensional karnaugh map shown in FIG. 4a. Each level represents a different value of bit pair 3. For a six bit address word the required operations to be conducted on the address words must change five of the six bits in the address words. From FIGS. 6b–6e it can be seen that there are three such operations, the operation shown in FIG. 6e being in fact the inverse of that shown in FIG. 6b and is therefore not of interest. The operations labelled as A, B and C in FIGS. 6c and 6d can be described as follows;

Operation A=increment bit pair 1, invert bit pair 2, invert bit pair 3,

Operation B=invert bit pair 1, increment bit pair 2, invert bit pair 3,

Operation C=invert bit pair 1, invert bit pair 2, increment bit pair 3.

The sequence of operations required to produce the sequence of address decoders where the address word corresponding to each address decoder alternates five bits at a time is as follows:

perform operation A unless the word address repeats in which case perform a single operation B and resume operation A. Repeat this unless the address word repeats for both an operation A or an operation B, in which case perform a single operation C.

Referring to FIG. 7 which shows the first twenty terms of the sequence for address words for a six bit address word, starting at address word 000000, it can be seen that the sequence of operations falls into groups of four. The first four operations are themselves regarded as the first of a group and it can be seen that this group repeats after every four sets of four operations. That is to say, operation C is performed every sixteenth operation. The sequence can be readily implemented in a software program using nested loops of operations, or in hardware by the use of an appropriately clocked FIFO or flip flops.

If the value representing the average propagation delay for each of the address lines $a_5$ to $a_0$ is calculated as previously shown in Appendices 1 and 2, the value obtained is 1,008 for each address line, as compared to a value of 1,520 for address line $a_5$ when the decoders are arranged in an ordered sequential fashion. This represents a reduction in average propagation delay of approximately one third.

From the examples given for a four bit address word and a six bit address word a generalised sequence of operations for any address word can be deduced. Considering the general case of an address word having 2n bits, where n is a positive integer, then it can be seen that there will be n possible operations (for example, for the case of a six bit address word n=3 and the number of operations=3). The operations and the sequences of each operation can be denoted as follows:

Operation 1=increment bit pair 1, invert bit pair 2, invert bit pair n

Operation 2=invert bit pair 1, increment bit pair 2, - - - , invert bit pair n.

Operation n=invert bit pair 1, invert bit pair 2, - - - , increment bit pair n.

If K is defined as any integer between 1 and n−1, then the sequence of operations can be denoted as follows:

every 4K operations perform an operation (K+1), otherwise perform an operation 1, where K increments from 1 to (n−1).

It will be appreciated that the above analysis results in an ordering of the address decoders for the word lines where the average address line propagation delay is minimised. By arranging the address decoders in a memory array using this approach, the average propagation delay for the address lines is reduced and thus the speed at which the memory array can be addressed is correspondingly increased. Furthermore, as in the preferred embodiment, the average propagation delay values for the address lines are equal, the timing of various signals applied to the address decoders can be more easily determined.

What is claimed is:

1. An integrated circuit memory comprising:
   a plurality of storage elements arranged in rows and columns;
   a plurality of word lines, each word line connected to a respective row of storage elements and being connected to a respective address decoder;
   a plurality of address lines extending from address circuitry to said address decoders, each address decoder being connected to a certain combination of said address lines representing a certain address value to which the address decoder responds to assert its associated word line,
   wherein said address decoders are connected to said address lines in a manner such that only one of said address lines is connected to adjacent ones of said address decoders.

2. An integrated circuit memory according to claim 1 wherein said address decoders are connected to said address lines such that the average propagation delay of said address lines is substantially equal.

3. An integrated circuit memory according to claim 1, wherein the address lines are organised in pairs, each pair having a true address line and a complementary address line.

4. An integrated circuit memory according to claim 1, wherein said address lines extend substantially perpendicular to said word lines.

5. An integrated circuit memory according to claim 1, wherein the address decoders are connected such that all address lines except one are alternated between successive decoders.

6. A method of manufacturing an integrated circuit memory comprising: a plurality of storage elements arranged in rows and columns; a plurality of word lines, each word line connected to a respective row of storage elements and being connected to a respective address decoder; and a plurality of address lines extending from address circuitry to said address decoders, the method comprising:
   connecting each of said address decoders to a certain combination of address lines representing a certain address value to which that address decoder responds, wherein said connecting step is carried out so as to connect only one of said address lines to adjacent ones of the address decoders.

7. A method according to claim 6, which comprises the step of determining the average propagation delay for the address lines prior to implementing the connecting step.

8. A method of manufacturing an integrated circuit memory according to claim 7, wherein said address decoders are connected whereby the average propagation delay of said address lines is substantially equal.

9. A method of determining the connections between a plurality of address decoders and a plurality of address lines in a memory array, said method comprising:
   denoting n pairs of address bits, wherein the nth pair of address bits are the least significant bits of an address word;
   defining n operations of said n pairs of address bits, each operation changing the value of the address word when performed on said address word, wherein each Kth operation, where K is an integer between 1 and n, comprises incrementing the Kth pair of address bits by one term of a 2 bit Gray code and inverting the remaining pairs of address bits;
   performing said n operations in a predetermined sequence wherein operation (K+1) is performed every 4K operations, otherwise operation 1 is performed, where K increments from 1 to (n−1), whereby a sequence of address words is generated wherein only a single bit has the same value for adjacent address words in said generated sequence of address words.

* * * * *

UNITED STATES PATENT AND TRADEMARK OFFICE
CERTIFICATE OF CORRECTION

PATENT NO. : 6,529,396 B2
DATED : March 4, 2003
INVENTOR(S) : Paul Hammond

Page 1 of 1

It is certified that error appears in the above-identified patent and that said Letters Patent is hereby corrected as shown below:

Column 3,
Line 12, replace "lines ao" with -- lines $a_o$ --

Column 5,
Line 64, replace "aaxis represents" with -- a-axis represents --

Column 6,
Lines 2-3, replace "property of the twodi-mensional" with
-- property of the two-dimensional --

Signed and Sealed this

Ninth Day of September, 2003

JAMES E. ROGAN
*Director of the United States Patent and Trademark Office*